United States Patent [19]

Gareis

[11] Patent Number: 4,752,886

[45] Date of Patent: Jun. 21, 1988

[54] METHOD FOR ON-LINE TESTING OF LOAD CONTROL CIRCUITRY AND THE ASSOCIATED LOAD

[75] Inventor: Ronald E. Gareis, Charlottesville, Va.

[73] Assignee: General Electric Company, Charlottesville, Va.

[21] Appl. No.: 757,554

[22] Filed: Jul. 22, 1985

[51] Int. Cl.⁴ .......................................... G01R 19/00
[52] U.S. Cl. ...................................... 364/483; 371/25
[58] Field of Search ............... 364/480, 481, 483, 492, 364/551; 340/635, 638, 640, 644, 648, 650, 652, 515, 516; 361/93, 94, 96, 87; 371/15, 20, 25, 26

[56] References Cited

U.S. PATENT DOCUMENTS

| | | | |
|---|---|---|---|
| 4,176,780 | 12/1979 | Sacher et al. | 371/26 |
| 4,216,539 | 8/1980 | Raymond et al. | 371/20 |
| 4,317,412 | 3/1982 | Bolcavage et al. | 371/25 |
| 4,412,328 | 10/1983 | Homa | 371/25 |
| 4,475,150 | 10/1984 | D'Atre et al. | 364/483 |
| 4,564,942 | 1/1986 | Horiuchi | 371/15 |
| 4,618,954 | 10/1986 | Otobe et al. | 371/15 |
| 4,634,842 | 1/1987 | Payne | 340/650 |

FOREIGN PATENT DOCUMENTS 231609 12/1984 Japan ................................. 371/26

OTHER PUBLICATIONS

Elmore et al., "Automatic Fault Isolation for Digital Assemblies", *IBM Technical Disclosure Bulletin*, May 1972, vol. 14, No. 12, pp. 3767-3770.

Primary Examiner—Parshotam S. Lall
Attorney, Agent, or Firm—Ormand R. Austin

[57] ABSTRACT

A method is disclosed for determining the operability of a switching device controlling an electrical load and the status of the load as open, shorted, or normally connected, without disruption of the operative state of the load. The method includes the steps of: (1) commanding the switching device to switch the load to the opposite state for a momentary period less than required for an actual change of state; (2) measuring electrical responses as an indication of the operability of the switching device and the status of the load; and (3) repeating the momentary switch of the load for increasingly longer periods of time until the status of the load is determined or until the momentary time period reaches limiting time duration.

3 Claims, 3 Drawing Sheets

METHOD FOR ON-LINE TESTING OF LOAD CONTROL CIRCUITRY AND THE ASSOCIATED LOAD

This invention relates to a method for on-line, non-disruptive testing of circuitry controlling the application of power to a load and of the load itself.

BACKGROUND OF THE INVENTION

High reliability is an essential characteristic of so called "critical use" control systems. In nuclear power facilities and off-shore drilling platforms, for example, the control systems therein utilized must function on demand and precisely as expected.

One way to increase reliability is to test the system frequently to see that it performs as expected. If a component or subsystem fails under test, corrections can be made to avoid an in-service failure and its more severe consequences.

Testing is easy, of course, if the process or device being controlled can be disrupted for the duration of the test or if the test can be postponed until a scheduled down time. These options are most frequently not feasible, however, and there has been considerable interest in developing methods for on-line, non-disruptive testing.

A known on-line test technique is to briefly pulse the output load device or process under control to determine if the electrical responses are appropriate. The pulse duration is kept very brief to avoid overcoming the inertia (electrical and mechanical) of the load device so that there is no actual change in its state. Thus, for example, a motor or electro-mechanical relay might be pulsed very briefly (either to turn On or turn Off), but not long enough for the motor or relay to actually respond. The electrical responses to the pulse are then used to diagnose the system. That is, the voltage and current responses to the pulse must appear to be correct.

Although the described pulse method has been of significant value, there are circumstances wherein the test is inconclusive. Frequently, the pulses are of such short duration that no conclusion can be drawn. The reason for this, of course, is that the pulses must be kept short to avoid disrupting the load.

Accordingly, among the objects of the present invention, it is sought to provide an on-line, non-disruptive test method that overcomes shortcomings of the above described presently available pulse test method.

Another object of the invention is to provide an on-line, non-disruptive test method which is useful with control systems which use dispersed or distributed input/output modules. A more particular object in such cases is to determine, substantially continuously, and on-line, the operability of an input/output module and the status of the loads associated therewith.

SUMMARY OF THE INVENTION

These and other objects are attained by providing, in a preferred form of the invention, a method for determining the operability of a switching device controlling the energization and deenergization of an electrical load and the status of the load as open, shorted, or normally connected, without disruption of the on-line, operative state of the load. In brief summary the method includes the steps of: (1) commanding the switching device to switch the load to the opposite state from that presently commanded (e.g., from deenergized to energized), for a momentary period substantially less than required for an actual change of state; (2) measuring electrical responses associated with the switching device as an indication of the operability of the switching device and the status of the load; and (3) repeating the momentary switch of the load for increasingly longer periods of time until the status of the load is determined or until the momentary time period reaches a preselected, limiting time duration.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawing in which:

DETAILED DESCRIPTION OF THE INVENTION

Figure 1:
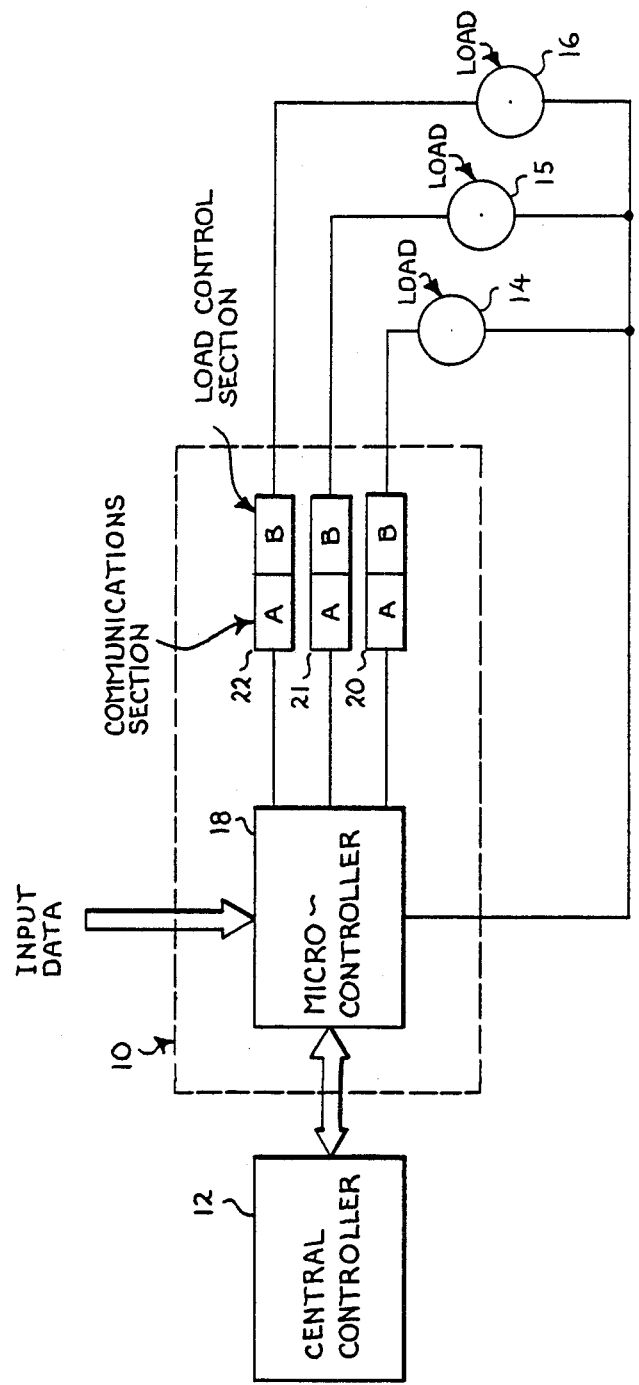
FIG. 1 is a simplified block diagram of an output section of a control system for illustrating the implementation of a test method according to the invention.

In FIG. 1, an input/output module 10 provides the interface between a central processing unit (CPU) 12 and the process being controlled. The output module 10 may be remotely located, in proximity to the process, and some distance from the CPU 12 which may, for example, be in a central control room. The process under control may take virtually any form but, in any case, includes certain load devices, such as motors, relays, solenoids, and so forth, designated generally as loads 14, 15 and 16. Loads 14–16 are controlled by CPU 12 in accordance with a stored program and as a function of input information from the process. The input information is derived from various sensing devices (not illustrated) such as pressure, temperature, and limit switches associated with various parts of the process. The input/output module 10 is generally the interface between the CPU 12 and the process and is capable of receiving information from sensing devices and of controlling the application of power to a number of loads. A microcontroller 18 in the front end of the module 10 includes an associated memory (not illustrated) for implementation of a stored program of instructions. The microcontroller 18 provides local control of the internal operations of O module 10 and coordinates the exchange of information with the CPU 12 which directs overall control of the process.

The loads 14–16 are energized and deenergized by corresponding output circuits 20–22, respectively. Each output circuit, 20–22, includes a communications section and a load control section, designated A and B, respectively. The output circuits 20–22, for purposes of explaining the invention, may be viewed simply as the power devices which, upon command, turn the electrical power On or Off to the associated load. Each output circuit, 20–22, however, also provides diagnostic signals indicative of the voltage and current occurring at various points in the circuit. These diagnostic signals are returned to microcontroller 18 and ultimately to the central controller 12, as necessary. Input/output module 10 is preferably of the type disclosed in U.S. patent application Ser. No. 617,096, which is of common assignee with the present invention, the disclosure of which is incorporated herein by reference.

The present invention is directed to a method for testing the status of each load (i.e., determining whether open, disconnected, or shorted) and the operability of the circuitry which energizes and deenergizes the load, e.g., the load control section B of an output circuit. The method of the invention is carried out while the process is being controlled and without disruption of the process.

Figure 2:
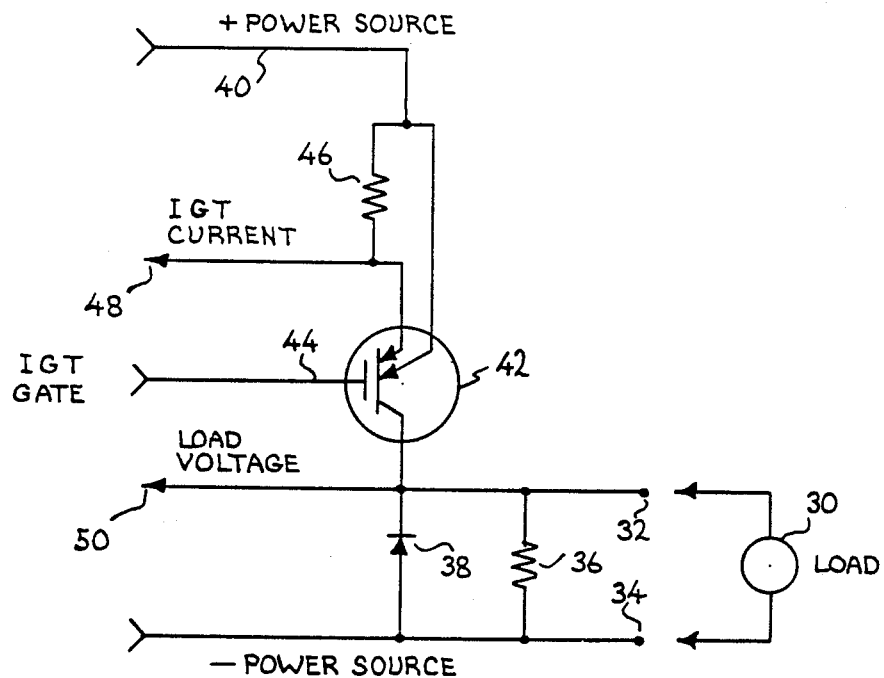
FIG. 2 is a more detailed schematic of an input/output switching circuit of a type used in a distributed industrial control system such as shown in FIG. 1 and is shown herein for describing the operative features of the invention.

FIG. 2, showing the details of an output switching circuit of a type which may be used in the output circuit of FIG. 1, is referred to for a discussion of a preferred form of the invention. The load 30 being controlled is connected between terminals 32 and 34. In parallel with these terminals, a pre-load resistor 36 and free-wheeling diode 38 are connected. Current to the load 30 from the positive power rail 40 is controlled by a power switching device 42 which is preferably an insulated gate transistor (IGT) which is a semiconductor switching device capable of being commanded both into and out of conduction by control signals applied to its gate terminal 44. The IGT 42 is most preferably of the type having a main current section and an emulation section which facilitates monitoring the total current through the IGT 42 and the load 30. Burden resistor 46, in series with the emulation section of the IGT, is used to develop a signal indicative of IGT and load current. An IGT having a current emulation section is disclosed in U.S. patent application, Ser. No. 529,240 of common assignee with the present invention. Although the invention is explained in connection with an IGT, it will be recognized that other power switching devices may be used with an appropriate shunt device (or other means) to develop a current indicative signal.

In operation, the IGT 42 is switched On or Off to control the flow of current to the load 30. Diagnostic signals are developed which are indicative of: (1) IGT and load current (appearing at terminal 48); and (2) the load voltage (appearing at terminal 50). These signals are returned to the microcontroller 18 of FIG. 1.

Figure 3:
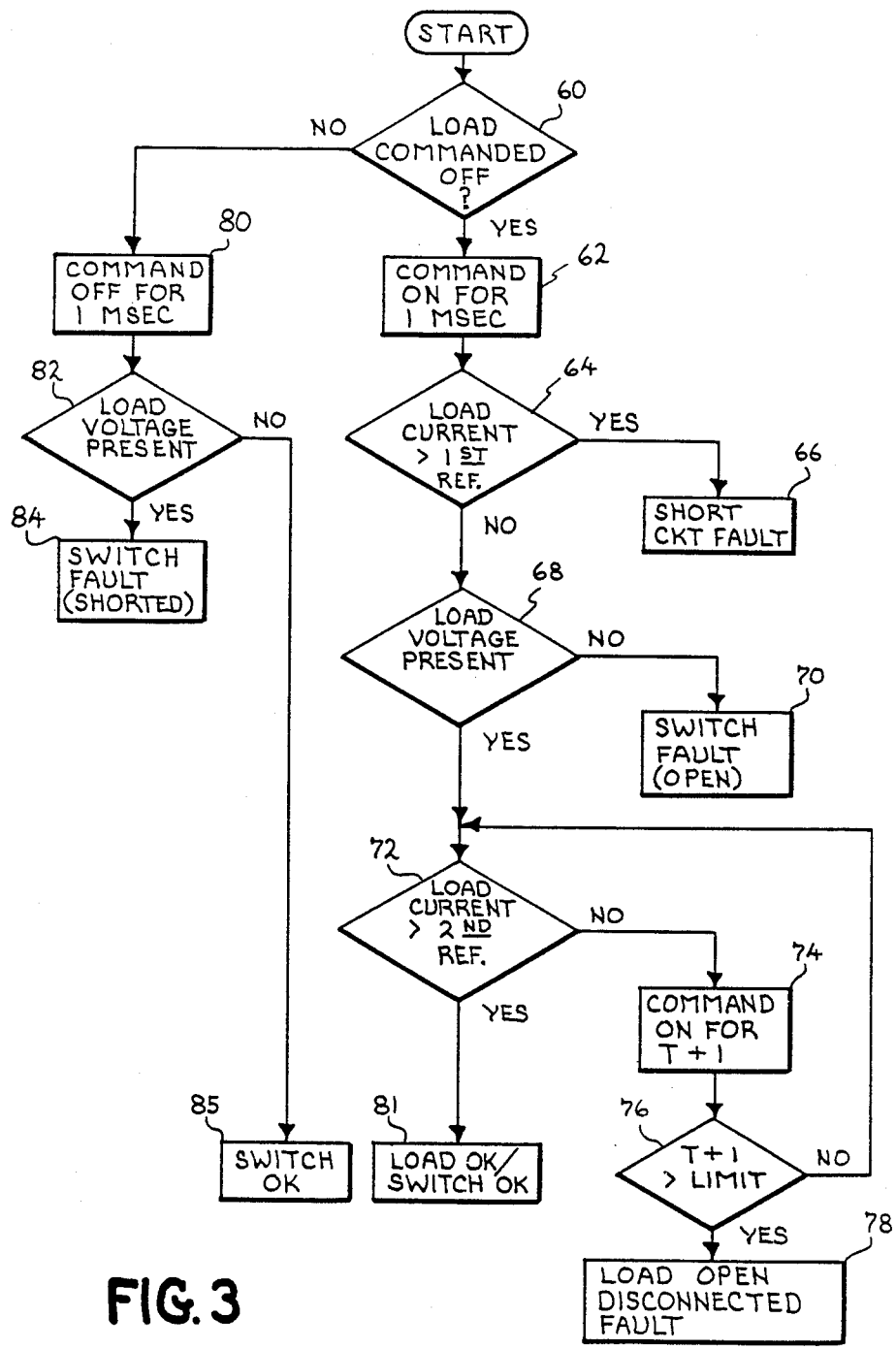
FIG. 3 is a flow chart showing the operative steps in a test method according to the invention.

Operability of the switching device (i.e., IGT 42) and the status of the load are tested on-line without disruption of the load according to the procedure set forth in the flow chart of FIG. 3 and as follows.

1. Initially the commanded state of the load is determined; that is, is the load directed to an On state or an Off state (decision block 60).

2. If the load is commanded to the Off state, the switching device is then commanded to turn On for a momentary period of time ( e.g., 1 millisecond) (block 62).

3. The resultant load current signal is compared to a first reference or threshold level of load current (decision block 64). If the load current is greater than the first reference level, a short circuit fault is indicated; that is, it is concluded that the load is shorted (fault indicative block 66). In the context of the circuitry of FIG. 2, the load current signal is developed at terminal 48, and the comparison is carried out within the microcontroller 18.

4. If the load current is less than the first reference level a test is made to determine whether load voltage is present, i.e., the load voltage signal is determined (block 68). If there is an absence of load voltage, it is concluded that the switching device (e.g., the IGT 42 of FIG. 2) is faulty (fault indicative block 70).

5. If the load voltage is present, the load current signal is compared with a second reference or threshold level of load current; a load current above the second reference level is taken as an indication that the load is properly connected to the output terminals and is not open. The first reference level of load current is of higher magnitude than the second reference level. The first level is high to indicate a shorted load and may, for example, be in the range of 2-5 amperes; the second level is relatively low to indicate the presence of some load and may be in the range of 20-50 milliamperes.

6. Obtaining a load current response less than the second level is taken to be inconclusive of the load condition (current for certain load elements is lagging so that current simply cannot rise to the threshold within the On period). In the case, the switching device is commanded On for a second momentary period which is longer than the first period (e.g., On time is increased to 2 milliseconds) (block 74 showing previously commanded On-time increased by 1 time unit, e.g., by 1 millisecond).

7. A test is then made (decision block 76) to determine if the increased time is more or less than some preselected time limit (i.e., still substantially less than required to actually change the state of the connected load). If the commanded On time is less than the preselected time limit, the load current is again compared with the second reference level to determine the status of the load.

8. If the second reference level is not exceeded on a first increased On time, load status is still deemed to be indeterminate. In such case the On command is again increased in time duration (block 74) and the comparison of load current to the second reference level is again repeated (block 72) unless the total commanded On time (expressed as T+1 in FIG. 3) is greater than the preselected time limit (decisional block 76).

9. The duration of the On command is thus increased in steps until the On period is of such length that the current rises above the second reference level or the On duration reaches preselected time limit (e.g., 3 milliseconds).

10. If the preselected time limit for the On time is reached before the load current threshold (i.e., the second reference level) is reached, it is concluded that the load is either open or disconnected (fault indication box 78).

11. If, on the other hand, the load current increases above the second reference level before the momentary time duration (T+1) exceeds the preselected limit, it is concluded that both the load status is correct (i.e., normally connected and not opened or shorted) and that the load switching device is operative (block 81).

12. With the load initially commanded On (at the start of the flow chart), the following step in such case, is to command the load Off for a momentary period (e.g., 1 millisecond as indicated in block 80).

13. A test is then made to determine if load voltage is present with the switching device or load commanded off (decision block 82).

14. If load voltage remains while the switching device or load is commanded off, the switch is determined to be shorted (fault indicative block 84).

15. On the other hand, disappearance of the load voltage in such case indicates that the switch is operative, (block 85).

By these procedures the status of the load and the operability of the switching device are determined during operation on-line, without disruption of the connected load device. It will be recognized that the method can be carried out by diverse means. It is preferable, however, to include the method in the operating instructions for microcontroller 18 (FIG. 1) so that the procedure is under its direction. Preparation of a program of instructions for such purposes is well within the ordinary skill of the art. It will further be recognized that although certain steps are shown in sequence (as blocks 64 & 68 of FIG. 3), they may be implemented simultaneously or in reverse order.

Thus, while there has been shown and described what has been considered a preferred embodiment of the invention it is understood that various other modifications may be made therein. For example, the invention is adaptable for use with both AC and DC powered loads. In the case of DC systems the preselected time limit (decision block 76 of FIG. 3) might be on the order of 3 milliseconds; by comparison, for AC, the time limit might be one-half cycle of a 60 Hz power source. It is intended to claim all such modifications which fall within the true spirit and scope of the present invention.

What is claimed is:

1. For use with a switching device adapted to respond to commands for controlling the energization and deenergization of an electrical load, a method for determining the operability of the switching device and the status of the load without causing a change in the operating state of the load, comprising the steps of:
    (a) determining the presently commanded operating state of the load is energized or deenergized;
    (b) commanding the switching device to switch the load to the opposite state from the presently commanded state for a momentary period, said period being shorter in duration than required to cause an actual change in the state of the load;
    (c) measuring electrical responses to the momentary switch of states, such measured responses including the measurement of current through the load with respect to a maximum threshold value and with respect to a minimum threshold value and the measurement of voltage to the load; and
    (d) repeating steps (b) and (c) for longer momentary periods until the status of the load is determined or until the momentary period reaches a predetermined duration whichever is first to occur, the predetermined duration being shorter than would result in an actual change of state of the load.

2. The method of claim 1 wherein a load current in step (c) of less than the minimum threshold value is taken as indeterminate of load condition; a load current greater than the maximum threshold value is taken as an indication of a shorted load; and the load voltage is taken as an indication of the operability of the switching device.

3. A method for on-line testing of the operability of an output circuit of the type having an insulated gate transistor (IGT) controlling the application of power to a load and of testing the status of the load as shorted, open, or in a normal condition, without disruption of the state of the load, such method comprising the steps of:
    (a) ascertaining if the IGT is commanded On or Off;
    (b) commanding a momentary period of time shorter in duration than required to change the state of the load;
    (c) performing the following substeps if the IGT is commanded from Off to On in step (b) irrespective of the time duration of step (b);
        (i) comparing the level of current through the load with respect to first and second pre-selected reference levels, said first reference level representing a higher value of load current than the second reference level, and detecting voltage applied to the load, each as a result of the momentary command of step (b);
        (ii) indicating a normal load condition if the load current is less than the first reference and greater than the second; indicating a shorted load if the load current is greater than the first reference; indicating a shorted load if the load current is greater than the first reference; indicating an indeterminancy with respect to the load if the load current is less than the second reference; and indicating the operability of the IGT from the voltage applied to the load; and
        (iii) if the load status remains indeterminate after substep (ii), continuously repeating step (b) and the preceding substeps with an increased duration of the momentary period of time on each repetition and comparing the level of current through the load with the second reference level until the load current increases above the second reference level or the momentary period of time reaches a pre-selected time limit, as an indication of the status of the load;
    (d) performing the following substeps if the IGT is commanded from On to Off instep (b) irrespective of the time duration of step (b):
        (i) detecting voltage applied to the load; and
        (ii) indicating the operability of the IGT from the voltage applied to the load.

* * * * *